(12) United States Patent
Takahashi et al.

(10) Patent No.: US 6,351,170 B1
(45) Date of Patent: Feb. 26, 2002

(54) LOW POWER CONSUMPTION TYPE DIGITAL LOGIC CIRCUIT

(75) Inventors: Tsugio Takahashi; Satomi Horita, both of Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/583,038

(22) Filed: May 30, 2000

(30) Foreign Application Priority Data

May 28, 1999 (JP) .......................................... 11-149081

(51) Int. Cl.[7] .......................... H03K 17/18; H03K 3/356
(52) U.S. Cl. ........................................ 327/218; 327/198
(58) Field of Search ................................ 327/199, 218, 327/217, 216, 544, 202, 198, 551, 34

(56) References Cited

U.S. PATENT DOCUMENTS 5,357,144 A * 10/1994 Tanaka ........................ 327/218

* cited by examiner

Primary Examiner—Dinh T. Le
(74) Attorney, Agent, or Firm—Ostrolenk, Faber, Gerb & Soffen, LLP

(57) ABSTRACT

A gated clock type logic circuit is provided in which timing designing for a supply of a clock can be made easy and a period of time required for designing can be shortened. The gated clock type logic circuit has a gate circuit designed to allow a clock signal inputted in accordance with a level of a clock enabling signal to be passed or to be masked. An output of the gate circuit to control a latching timing of a latch circuit for receiving data is fed to a clock input terminal of the latch circuit. The gated clock type logic circuit is provided with a selector which receives an input data and an output data from the latch circuit and selects either of the input data or the output data by using a data enabling signal as a selecting signal and outputs it. An output from the selector is fed to a data input terminal of the latch circuit.

11 Claims, 13 Drawing Sheets

LOW POWER CONSUMPTION TYPE DIGITAL LOGIC CIRCUIT

BACKGROUND OF THE INVENTION

1. Field of the Invention

The present invention relates to a logic circuit and more particularly to a logic circuit provided with a gate in a clock supplying line and a semiconductor logic integrated circuit.

2. Description of the Related Art

In a digital logic circuit (hereinafter also referred to as a logic circuit) in which a clock frequency is approximately proportional to power consumption, one method to lower the power consumption of the logic circuit is to use, a gated clock type logic circuit in which a gate circuit is inserted into a clock supplying line and a supply of a clock is suspended while the logic circuit is not operating. By using this method, if, for example, an average clock frequency can be reduced by a factor of ten by the suspension of the supply of clock, the power consumption of the digital logic circuit is lowered approximately by the factor of ten as well, thus achieving greatly lowered power consumption.

However, a conventional logic circuit (also referred to as a gated clock type logic circuit) has the following problems. In the digital logic circuit, an occurrence of spike noise in the clock supplying line causes a malfunction in the logic circuit. When the gate circuit is inserted into the clock supplying line, if a full adjustment of operational timing at a time of designing had not been made, there would be a possibility of the occurrence of spike noise in the clock supplying line. That is, the gated clock method presents a problem in that there is difficulty in designing of operational signal timing and much time is required for the designing and adjustment of the timing.

FIG. 14 is a schematic block diagram showing one example of configurations of a conventional gated clock type logic circuit. As shown in FIG. 14, a data input DATA (1) is inputted to a data input terminal D of a D-type flip flop 1 and a clock is inputted to a clock input terminal C of flip-flop 1. A data output DATA (0) is outputted from an output terminal Q. The clock input terminal C is connected to an output from a gate circuit 2 in which a clock enabling signal and a clock signal are inputted to its input terminals. The clock enabling signal is supplied from an output Q of a D-type flip flop 5 which, in turn, operates to latch the clock enabling signal fed from a previous stage using the clock signal and to output it through its output terminal Q.

FIG. 15 is a timing chart showing normal operations of the conventional gated clock type logic circuit shown in FIG. 14 while the clock supplying line picks up no spike noise. In FIG. 15, a "signal waveform at a terminal C" represents the signal waveform occurring at the clock input terminal C of the D-type flip flop 1.

Referring to FIG. 15, when the clock enabling signal outputted from the D-type flip flop 5 is inactive (or high), the clock signal is masked in the gate circuit, while, when the clock signal is active (or low), the clock passes through the gate circuit 2 and is outputted from the gate circuit 2, when the D-type flip flop 1 operates to latch a portion ① of the data input DATA (1) by a rising edge and to output it as a data output DATA (0).

FIG. 16 is a timing chart showing an example in which a fall of the clock enabling signal lags behind a fall of the clock signal, causing the occurrence of the spike noise at the clock input terminal C of the D-type flip flop 1 and resulting in a malfunction in the circuit. As shown in FIG. 16, while the clock enabling signal is active (or low), a portion ② of the data input DATA (1) is latched by a rising edge of the clock signal passing through the gate circuit 2 at the D-flip flop 1 and, since the rise of the clock enabling signal lags behind the fall of the clock signal, by the signal synchronizing to the rising edge of the clock enabling signal, a portion ③ of the data input DATA (1) is latched at the D-type flip flop 1 and is outputted as data output DATA (0).

The conventional gated clock type logic circuit, however, presents problems in that, if the rise of the clock enabling signal lags behind the fall of the clock, since the spike noise causing the malfunction in the circuit occurs, in a high speed circuit having a short clock period or in a system providing a poor clock duty cycle, its use is limited in range of application.

FIG. 17 is a timing chart showing an example in which, because a delay of the clock signal occurs in the clock supplying line connected to the gate circuit, the fall of the clock enabling signal leads the rise of the clock, thus causing the occurrence of the spike noise at the clock input terminal C and resulting in the malfunction in the logic circuit. That is, in this case, while the clock enabling signal is active, by the rising edge of the clock passing through the gated circuit 2, a portion ② of the data input DATA (1) is latched at the D-type flip flop and then by the signal synchronizing to the rising edge of the clock enabling signal, a portion ③ of the data input DATA (1) is latched at the D-type flip flop 1.

As described above, in the conventional gated clock type logic circuit, if the spike noise occurs in the clock supplying line of the D-type flip flop, data stored in the D-type flip flop is read and, at a same time, new data is captured, resulting in changes of levels at the flip flop due to influence of the spike noise, causing the malfunction in the logic circuit. Since an increase in time required for designing of the signal timing is proportional to an increase in a count of gated clock supplying lines used in a device, use of the gated clock type logic circuits tends to generally be minimized especially in a case of highly integrated circuits such as LSIs. This means that there is a relation of a trade-off between lowered power consumption in a circuit and ease in designing and time period required for designing, thus making it impossible to satisfactorily lower power consumption in the logic circuit.

Highly integrated circuits such as LSIs are designed in such a general manner that descriptions of functions and their verification are performed by using a Hardware Description Language and a gate circuit of such LSIs is synthesized based on hardware description by using a logic synthesizing tool. However, generally, most of the logic synthesizing tools are provided assuming that they would be used for a clock one phase synchronizing circuit and not for gated clock circuits and, therefore, if an existing synthesizing tool is to be employed for conventional gated clock circuits, a special way of writing is required to describe functions or only limited synthesizing tools can be used since the conventional gated clock circuit lacks in versatility in terms of ways of descriptions and designing environments, the logic circuit cannot be designed by using the existing logic synthesizing tool.

SUMMARY OF THE INVENTION

In view of the above, it is an object of the present invention to provide a gated clock type logic circuit provided with a gate in its clock supplying line in which timing design can be made simple and a period of time required for designing can be shortened.

It is another object of the present invention to provide the gated clock type logic circuit which can be designed by using an existing logic synthesizing tool.

According to a first aspect of the present invention, there is provided a logic circuit including:

a gate circuit operating to allow a clock signal inputted in accordance with a level of a clock enable signal to be passed or to be masked;

a latch circuit to a clock input terminal of which an output from the gate circuit to control a latch timing for receiving data is fed;

a selector circuit into which input data and an output of the latch circuit operates to output either of the input data or the output from the latch circuit by using a data enabling signal as a selecting signal; and whereby an output from the selector circuit is fed to a data input terminal of the latch circuit.

In the foregoing, a preferable mode is one wherein one latch circuit operates to latch a data enabling signal fed from a signal source by using the clock signal and to output the latched data enabling signal to the selector circuit and another latch circuit operates to latch the clock enabling signal fed from the signal source by using the clock signal and to output the latched clock enabling signal it to the gate circuit.

According to a second aspect of the present invention, there is provided a logic circuit including:

two or more latch circuits into which a plurality of data is inputted;

two or more selector circuits into which input data and outputs from the latch circuit are inputted, operating to output either of the input data or the outputs by using a data enabling signal as a selecting signal;

two or more gate circuits operating to allow clock signals inputted in accordance with levels of clock enabling signals to be passed to the two or more latch circuits or to be masked; and whereby an output from each of the selector is fed to a data input terminal of each of the latch circuits and an output from each of the gate circuits is fed to a clock input terminal of each of the latch circuits.

In the foregoing, a preferable mode is one wherein two or more latch circuits operate to latch two or more data enabling signals fed from signal sources by using the clock signals and to supply the latched data enabling signals to two or more selector circuits and wherein two or more latch circuits operate to latch two or more clock enabling signals fed from signal sources by the clock signal and to supply the latched clock enabling signals to two or more gate circuits.

According to a third aspect of the present invention, there is provided a logic circuit including:

two or more latch circuits into which a plurality of data is inputted;

two or more selectors into which input data and outputs from the latch circuits operate to output either of the input data or the above outputs by using a data enabling signal as a selecting signal;

one gate circuit operating to allow a clock signal inputted in accordance with a level of a clock enabling signal to be passed to the above two or more latch circuit or to be masked, and wherein an output of each of the selectors is fed to each of data input of each of the latch circuits and wherein an identical output of the one gate circuit is fed simultaneously to each of clock input terminals of the latch circuits.

In the foregoing, a preferable mode is one wherein two or more latch circuits operate to latch two or more data enabling signals fed from signal sources by the clock signals and to supply the latched data enabling signals to the two or more selectors and wherein a latch circuit operates to latch a clock enabling signal fed from a signal source by using the clock signal and to supply the latched clock enabling signal to the one gate circuit.

Also, a preferable mode is one wherein the latch circuit is a D-type flip flop.

According to a fourth aspect of the present invention, there is provided a semiconductor integrated circuit including:

two or more latch circuits into which a plurality of data is inputted;

two or more selectors into which input data and outputs from the latch circuits operate to output either of the input data or the above outputs by using data enabling signals as selecting signals;

two or more macros containing the latch circuits each data input terminal of which an output from each of the selectors is fed;

two or more gate circuits operating to allow clock signals inputted in accordance with a level of a clock enabling signal to be passed to the macros or to be masked; and whereby an output from each of the gate circuits is fed to each of clock input terminals of the macros and whereby an identical clock inputted from each of the clock input terminals is simultaneously fed to each of clock input terminals of the two or more latch circuits contained in each of the macros.

In the foregoing, a preferable mode is one wherein the macro and other macro having no gate circuit operating to allow the clock to be passed to its clock input terminal or to be masked exist in a same chip in a mixed state.

Also, a preferable mode is one wherein a buffer operating to make a signal delay equal is provided between the gate circuit and the clock input terminal.

Furthermore, a preferable mode is one wherein other buffer operating to make a signal delay equal is provided in each of clock input terminals of the macros into which a clock signal is directly inputted.

BRIEF DESCRIPTION OF THE DRAWINGS

The above and other objects, advantages and features of the present invention will be more apparent from the following description taken in conjunction with the accompanying drawings in which.

DETAILED DESCRIPTION OF THE PREFERRED EMBODIMENTS

Best modes of carrying out the present invention will be described in further detail using various embodiments with reference to the accompanying drawings.

First Embodiment

Figure 1:
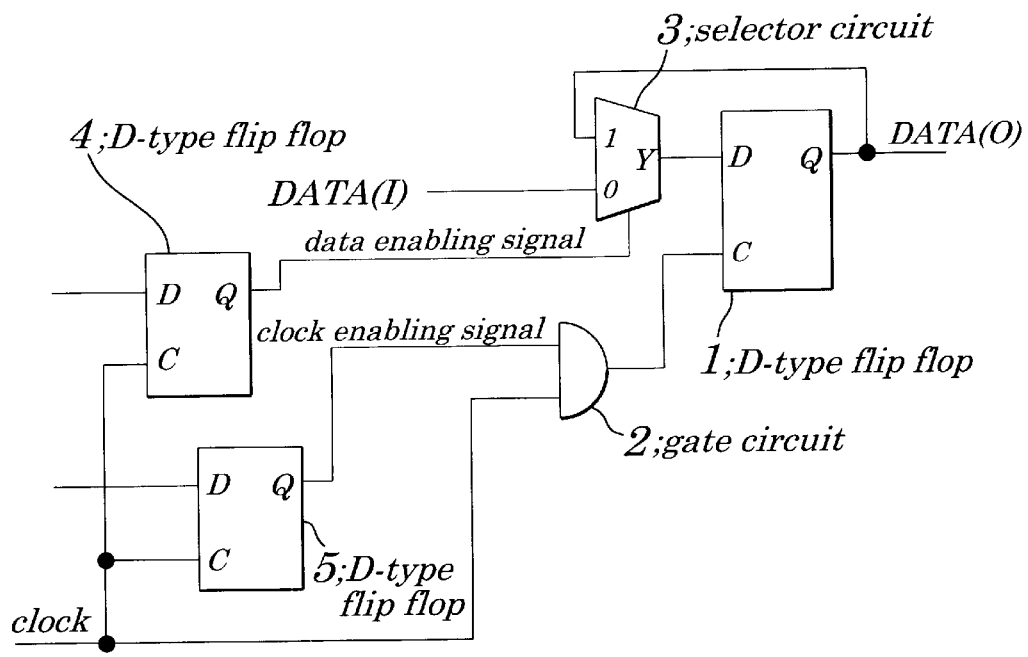
FIG. 1 is a schematic block diagram showing configurations of a gated clock type logic circuit according to a first embodiment of the present invention.

FIG. 1 is a schematic block diagram showing configurations of a gated clock type logic circuit according to a first embodiment of the present invention. As shown in FIG. 1, a data input terminal D of a D-type flip flop 1 is connected to an output terminal of a selector circuit 3. A data input DATA (I) and a data output DATA (O) outputted from the D-type flip flop 1 are inputted to the selector circuit (also called a selector circuit for a feedback circuit) and the selector circuit 3 operates to output either of the data input DATA (I) or the data output DATA (O) in accordance with a signal level of a data enabling signal inputted into a selecting signal input terminal.

A D-type flip flop 4 is a last-stage D-type flip flop (its previous flip flop is not shown) adapted to latch the data enabling signal and to output it. A D-type flip flop 5 is a last-stage D-type flip flop (its previous flip flop is not shown) adapted to latch the clock enabling signal and to output it.

To a clock input terminal of the D-type flip flop 1 is inputted a clock from a gate circuit 2. A supply of and stop of the supply of the clock to the D-type flip flop 1 is controlled by the gate circuit 2. To one input terminal of the gate circuit 2 is inputted a clock and to an other input terminal of the gate circuit 2 is inputted a clock enabling signal outputted from the D-type flip flop 5. In the gated clock type logic circuit shown in FIG. 1, even if a clock supplying line picks up spike noise, data is held by a feedback circuit to prevent a malfunction in the flip flop.

Since the gated clock type logic circuit of the present invention is so configured that no malfunction occurs even when the clock supplying line picks up spike noise, it has the following advantages:

(1) A gated clock supplying method can be employed in designing the gated clock type logic circuit without giving any consideration to timing of the clock supplying line, thus allowing lowered power consumption.

(2) The gated clock type logic circuit can be employed even in highly integrated circuits such as LSIs, thus lowering the power consumption as well.

Next, operations of the gated clock type logic circuit will be described below in detail by referring to FIG. 1. The gate circuit 2 is an OR circuit having two inputs. A clock supplying line of the D-type flip flop 1 is connected to the gate circuit 2. The selector circuit 3 is a feedback circuit operating to hold data of the D-type flip flop 1. The D-type flip flop 4 constitutes the last-stage flip flop of a data enabling signal generating device. The D-type flip flop 5 constitutes the last-stage flip flop of a clock enabling signal generating device. The clock enabling signal is fed to one input terminal of the gate circuit 2. The data enabling signal is fed to the selecting terminal of the selector circuit 3.

Figure 2:
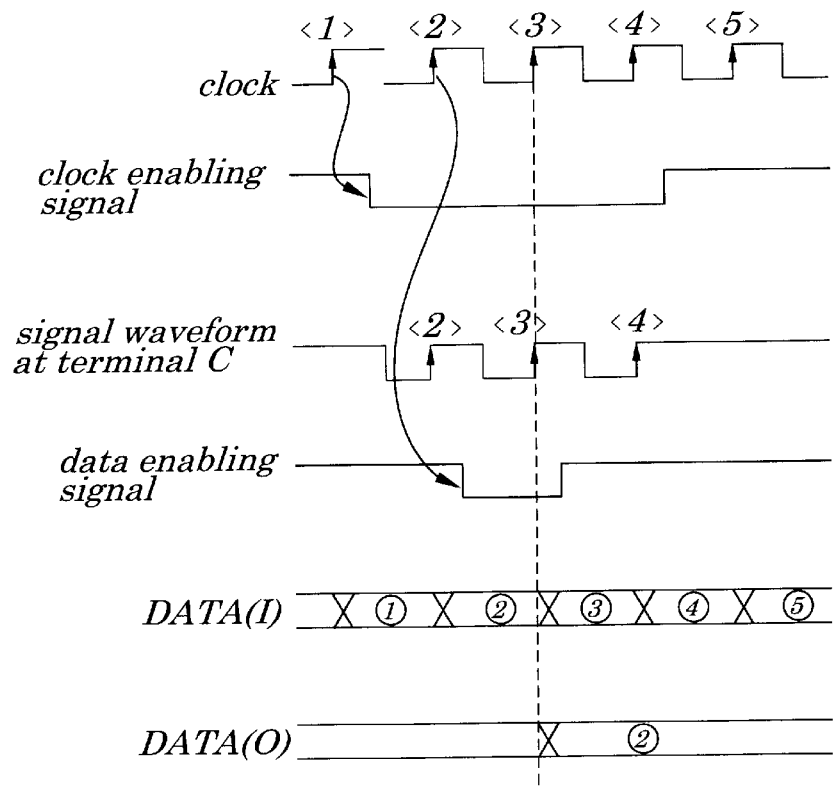
FIG. 2 is a timing chart explaining operations of the gated clock type logic circuit according to the first embodiment of the present invention.
Figure 3:
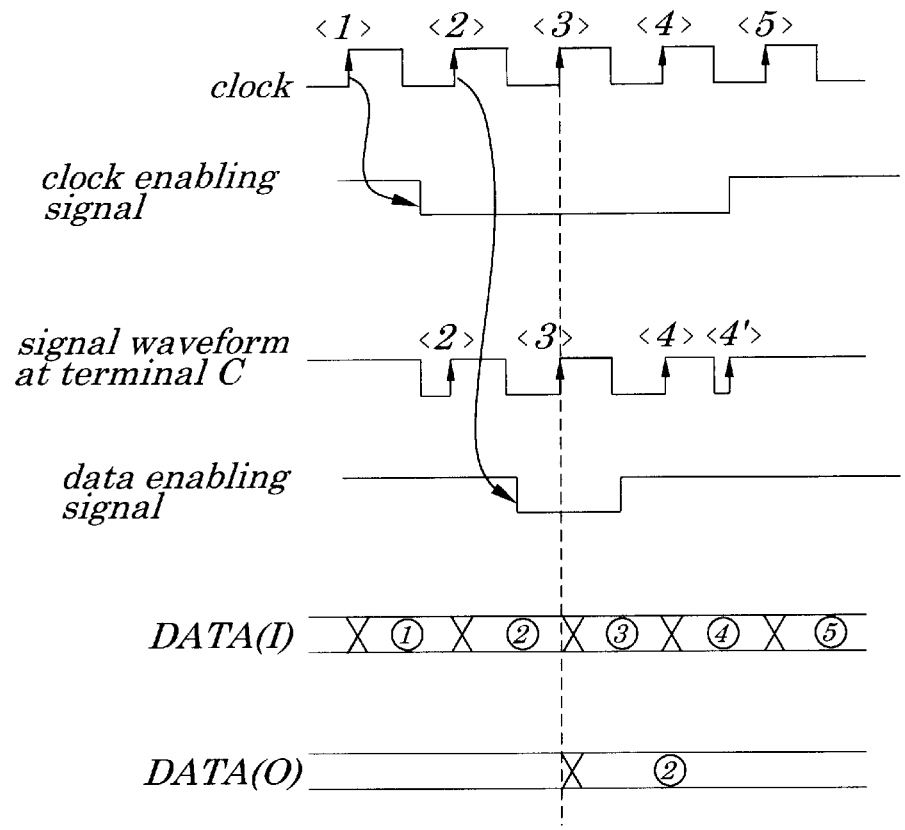
FIG. 3 is a timing chart explaining operations of the gated clock type logic circuit according to the first embodiment of the present invention.

FIGS. 2 and 3 are timing charts explaining operations of the gated clock type logic circuit according to the first embodiment of the present invention. FIG. 2 shows a case in which the clock enabling signal is produced by a rising edge of the clock and a fall of the clock enabling signal does not lag behind a fall of the clock signal. While the clock enabling signal is active (or low, that is, the signal used here is active LOW), three rising edges (2) (3) (4) of the clock signal are transferred to the clock input terminal C of the D-type flip flop 1. The selector circuit 3, only when the data enabling signal is active (or low), operates to output the data input DATA (I) to the data input terminal of the D-type flip flop 1.

The D-type flip flop 1 operates to capture a portion ② of the data input DATA (I) by the rising edge (3) of the clock signal and to output it as the data output DATA (O). While the data enabling signal is high, the data output DATA (O) of the D-type flip flop is fed from the selector circuit 3 to the data input terminal of the D-type flip flop 1. Then, the D-type flip flop 1 operates to capture a portion ② of the data input DATA (I) outputted from the selector circuit 3 by the rising edge (4) of the clock signal.

FIG. 3 shows a case in which the clock enabling signal is produced by the rising edge of the clock and the fall of the clock enabling signal lags behind the fall of the clock signal. While the clock enabling signal is active (or low), three rising edges (2) (3) (4) of the clock signal are transferred to the clock input terminal C of the D-type flip flop 1 and, since the fall of the clock enabling signal lags behind the fall of the clock signal, an additional rising edge (4') is produced, which is spike noise.

However, only when the data enabling signal is low, the D-type flip flop 1 is adapted to capture data. As shown in FIG. 3, the rising edge (3) only is used as a clock edge to capture the data. Because of this, there is no influence by the spike noise (4'). That is, while the data enabling signal is high, the data output DATA (O) of the D-type flip flop 1 is supplied from the selector circuit 3 to the data input terminal of the D-type flip flop 1 and, by the rising edges (4) and (4'), the portion ② of the data input DATA (I) outputted from the selector circuit 3 is captured. As is apparent from the timing chart shown in FIGS. 2 and 3, the gated clock type logic circuit of the present invention performs a same operation regardless of occurrence of the spike noise, that is, a malfunction caused by the spike noise on the clock supplying line does not occur accordingly. When the clock is supplied in such a gated manner, since a timing delay of one clock in the clock enabling signal is permissible, the gated clock type logic circuit can be employed in high speed circuits having even short clock periods.

Second Embodiment

Figure 4:
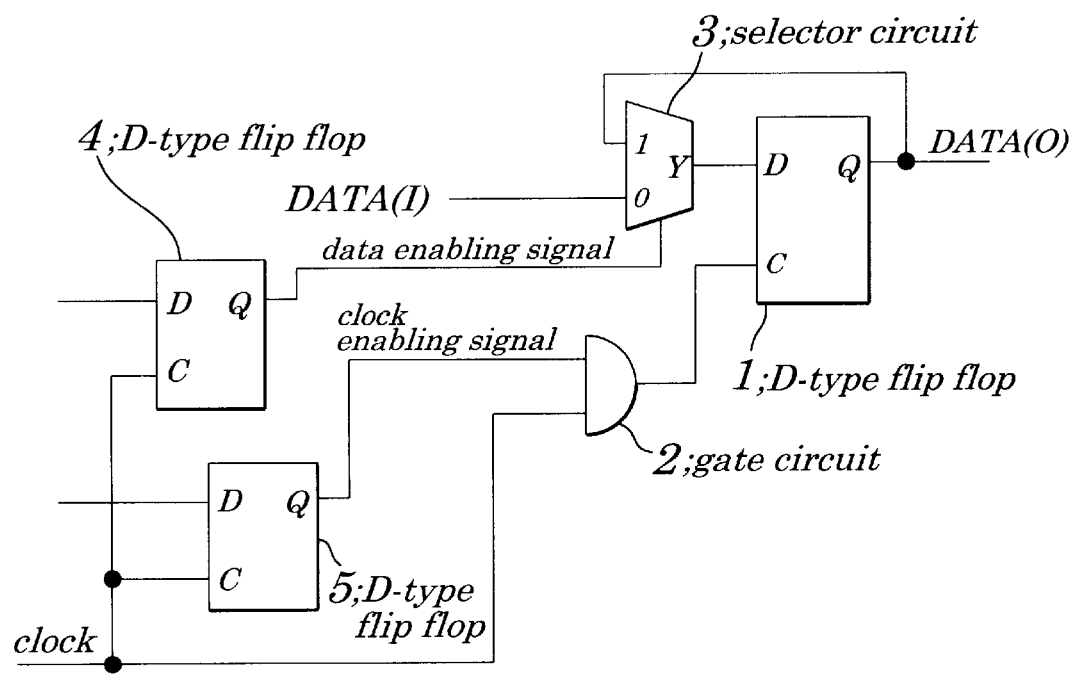
FIG. 4 is a schematic block diagram showing configurations of a gated clock type logic circuit according to a second embodiment of the present invention.
Figure 5:
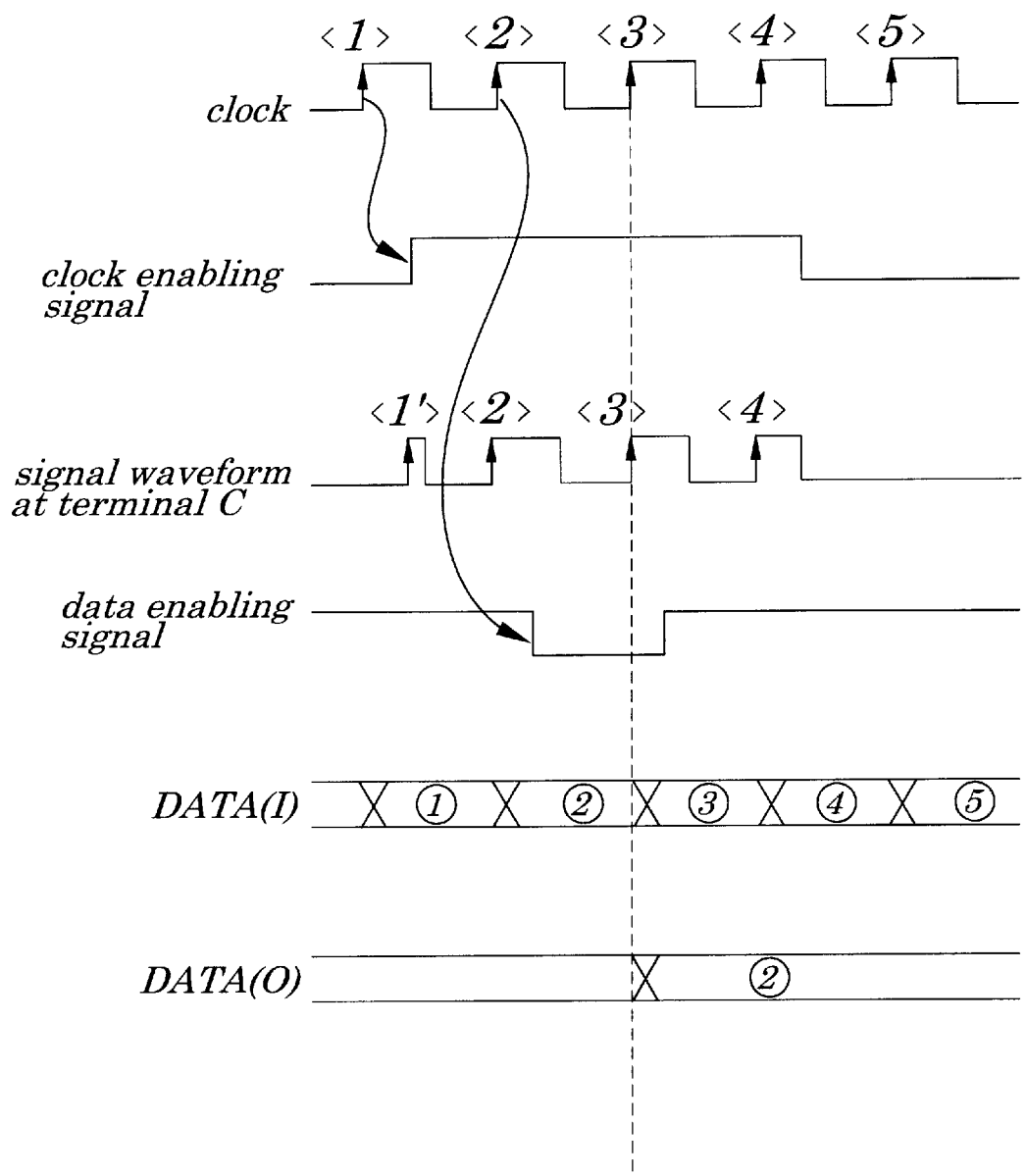
FIG. 5 is a timing chart explaining operations of the gated clock type logic circuit according to the second embodiment of the present invention.

FIG. 4 is a schematic block diagram showing configurations of a gated clock type logic circuit according to a second embodiment. In FIG. 4, a gate circuit is an AND circuit unlike in the case of FIG. 1 where it is an OR circuit. FIG. 5 is a timing chart explaining operations of the gated clock type logic circuit of FIG. 4.

In the gated clock type logic circuit of the second embodiment, a clock enabling signal used is active HIGH. According to the second embodiment, when a rise of a clock enabling signal leads a fall of a clock signal, spike noise occurs. In this case, a D-type flip flop 1, only when a data enabling signal is active, operates to capture a data input DATA (I) outputted from a selector circuit 3 by a rising edge of the clock signal and, when the data enabling signal is inactive, to capture a data output DATA (O) outputted from the selector circuit 3 by the rising edge of the clock signal. Therefore, even if a clock supplying line picks up such spike noise, no malfunction occurs in the gated lock type logic circuit.

Third Embodiment

Figure 6:
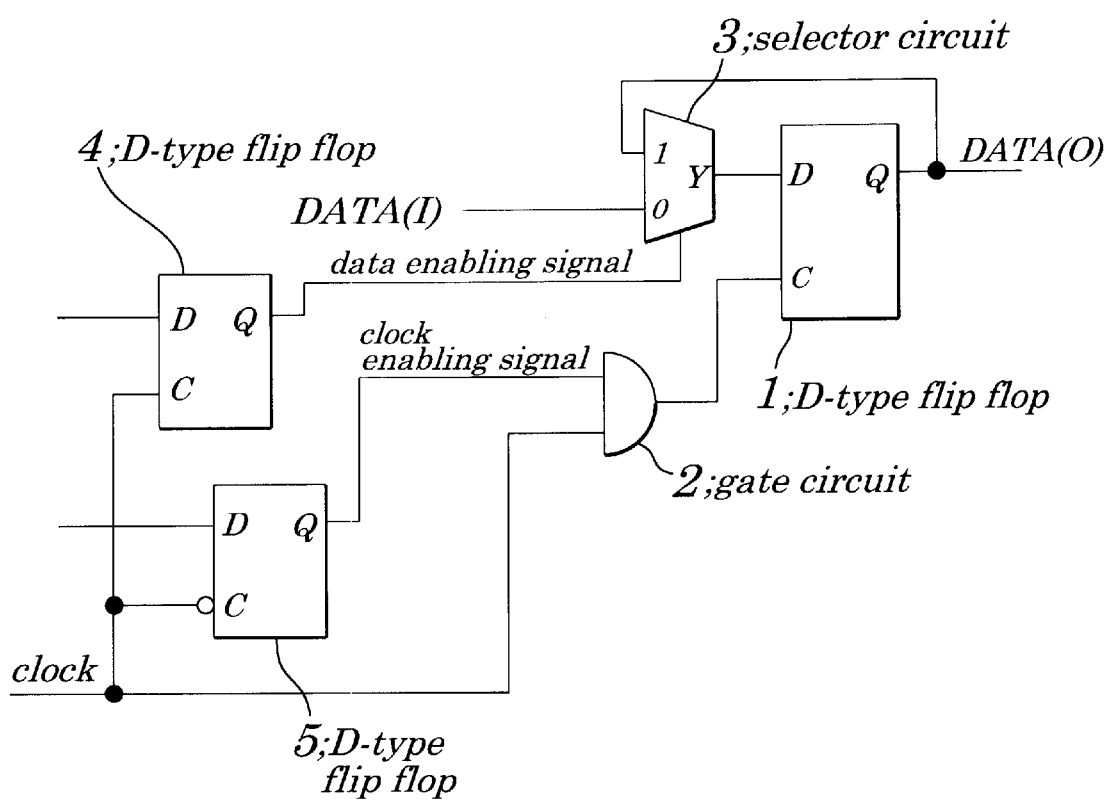
FIG. 6 is a schematic block diagram showing configurations of a gated clock type logic circuit according to a third embodiment of the present invention.

FIG. 6 is a schematic block diagram showing configurations of a gated clock type logic circuit according to a third embodiment. Referring to FIG. 6, in the gated clock type logic circuit according to the third embodiment, a D-type flip flop 5 being a last stage flip flop of a clock enabling generator employs a flip flop which operates by a trailing edge of a clock signal and outputs a clock enabling signal by the trailing edge of the clock signal.

Figure 7:
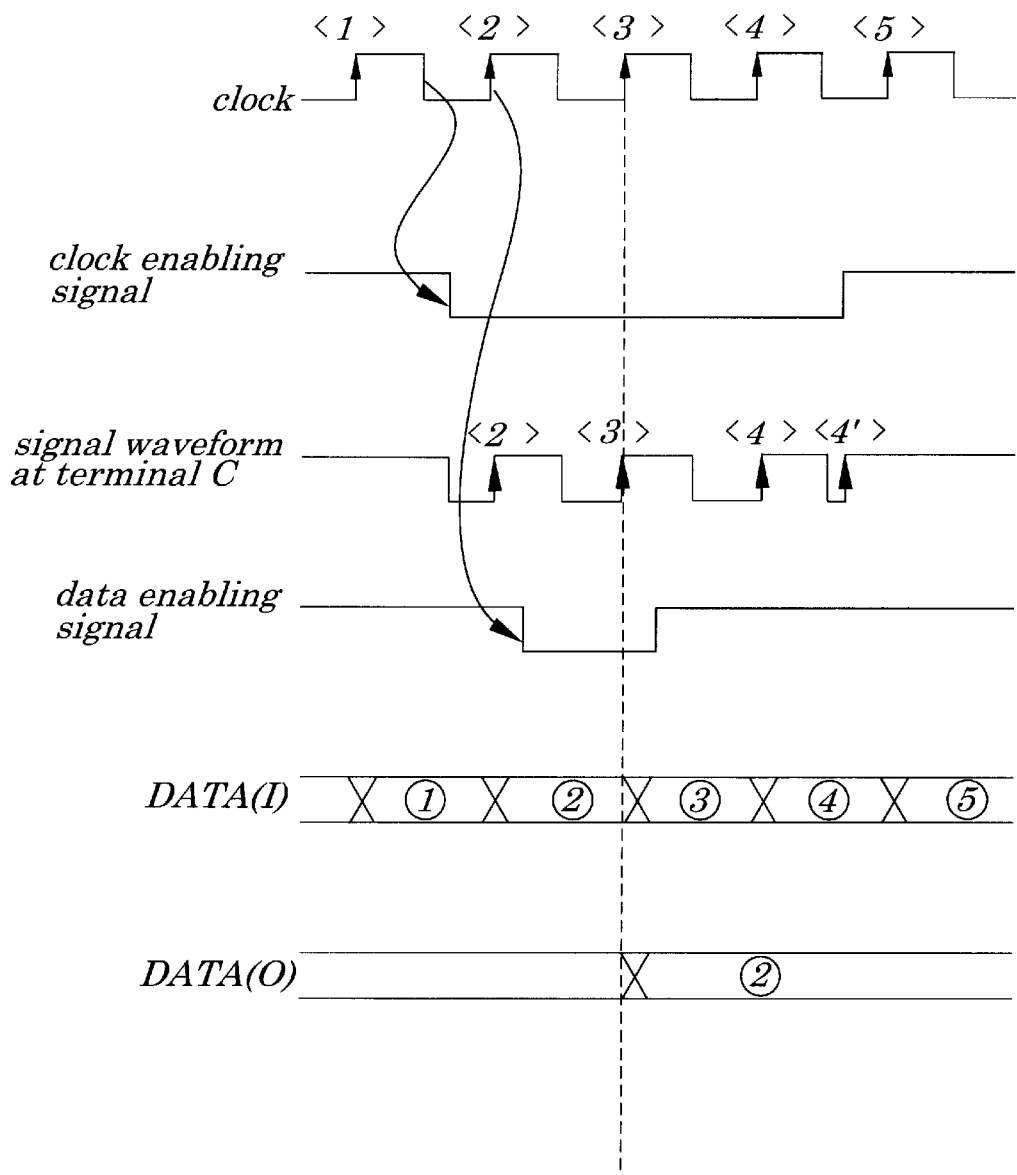
FIG. 7 is a timing chart explaining operations of the gated clock type logic circuit according to the third embodiment of the present invention.

FIG. 7 is a timing chart explaining operations of the gated clock type logic circuit according to the third embodiment of the present invention. Even when a rise of the clock enabling signal leads a fall of the clock signal, though spike noise occurs, a D-type flip flop 1, only when a data enabling signal is active, operates to capture a data input DATA (I) outputted from a selector circuit 3 by a rising edge of the clock signal and, when the data enabling signal is inactive, to capture a data output DATA (O) outputted from the selector circuit 3 by the rising edge of the clock signal, thus causing no malfunctions in the gated clock type logic circuit as well.

Fourth Embodiment

Figure 8:
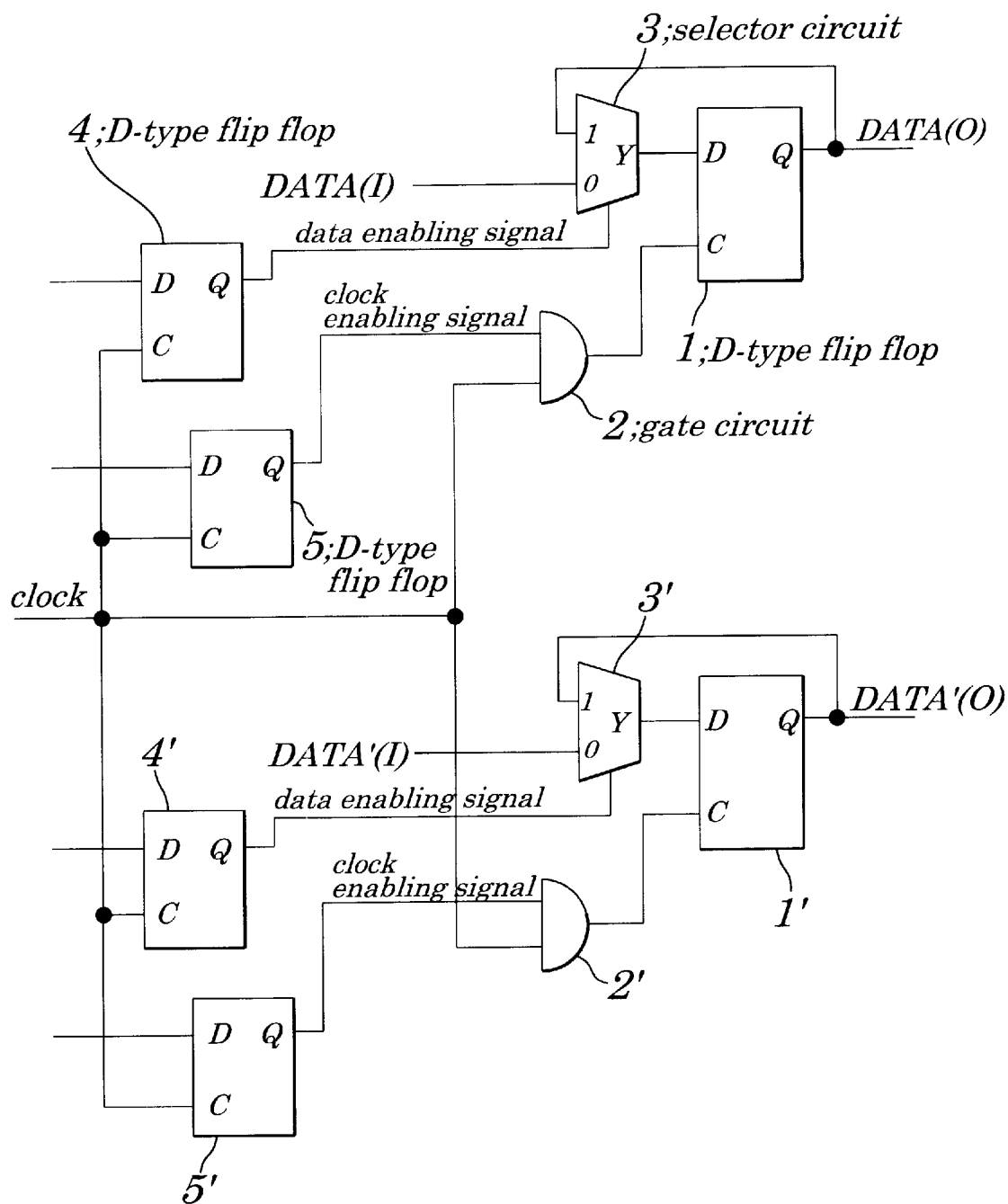
FIG. 8 is a schematic block diagram showing configurations of a gated clock type logic circuit according to a fourth embodiment of the present invention.
Figure 9:
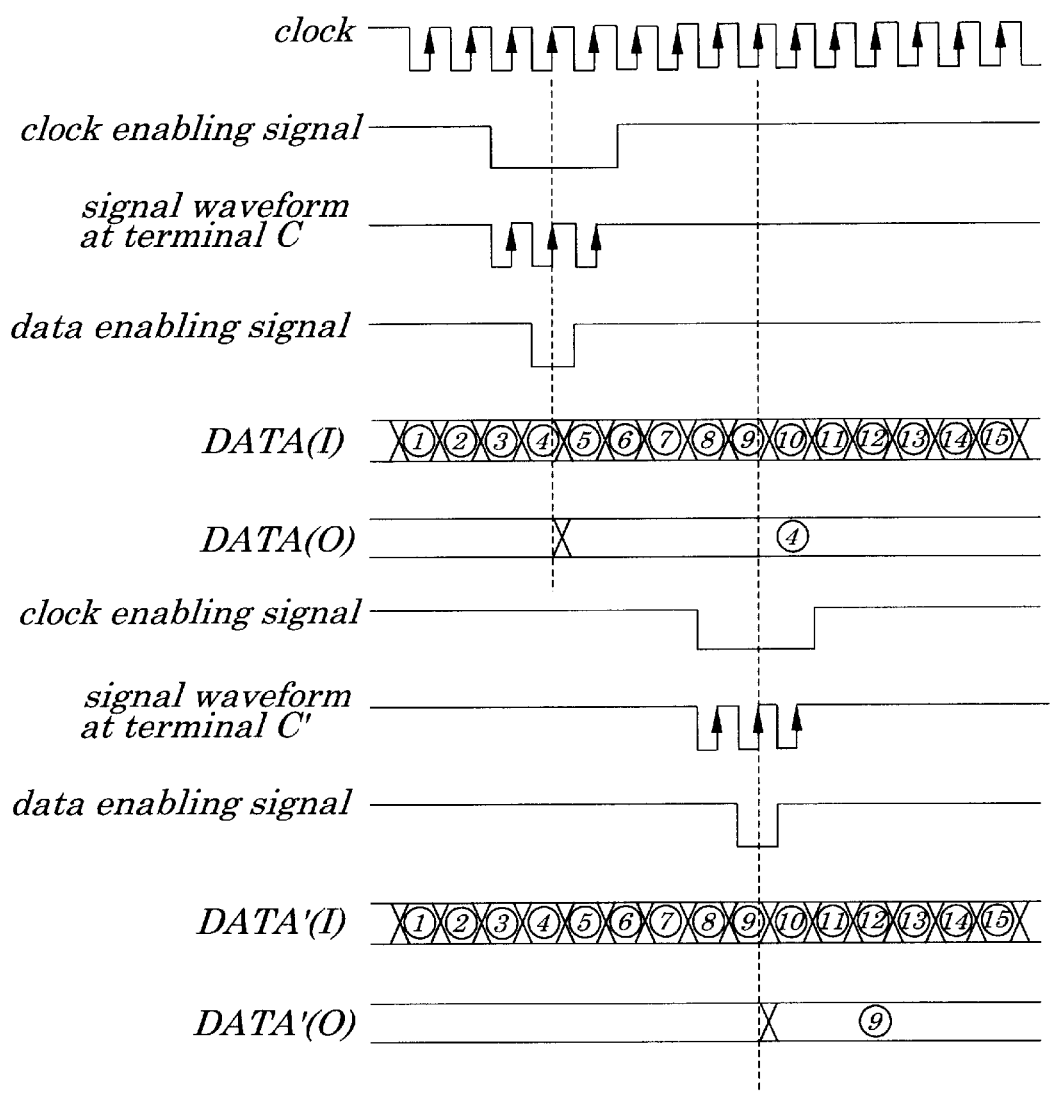
FIG. 9 is a timing chart explaining operations of the gated clock type logic circuit according to the fourth embodiment of the present invention.

FIG. 8 is a schematic block diagram showing configurations of a gated clock type logic circuit according to a fourth embodiment, in which two or more data enabling signals and two or more clock enabling signals are used. FIG. 9 is a timing chart explaining operations of the gated clock type logic circuit according to the fourth embodiment of the present invention. In FIG. 8, to an input terminal of a D-type flip flop 1 is connected an output terminal of a selector circuit 3. To an input terminal of a D-type flip flop 1' is connected an output terminal of a selector circuit 3'. To the selector circuit 3 (also called a selector for a feed-back circuit) are inputted a data input DATA (I) and a data output DATA (O) outputted from the D-type flip flop 1. To the selector circuit 3' (also called a "selector for a feed-back circuit") are inputted the data input DATA (I') and the data output DATA (O') outputted from the D-type flip flop 1'. A data enabling signal outputted from a D-type flip flop 4 is inputted to a selecting signal input terminal of the selector circuit 3 and another data enabling signal outputted from a D-type flip flop 4' is inputted to a selecting signal input terminal of the selector circuit 3'.

The D-type flip flops 4 and 4' are also last stage D-type flip flops operating to latch and output the data enabling signal respectively and D-type flip flops 5 and 5' are last stage D-type flip flops operating to latch and output the clock enabling signal respectively. To one input terminal of gate circuits 2 and 2', which are adapted to control a supply of and a stop of the supply of a clock to a clock input terminal of the D-type flip flops 1 and 1', are inputted a same clock in common and to the other input terminal of the gate circuits 2 and 2' are inputted clock enabling signals outputted from the D-type flip flops 5 and 5' respectively. FIG. 8 shows an example in which there are two clock enabling signals supplied from different D-type flip flops and there are two data enabling signals supplied from the different D-type flip flops, however, a count of enabling signals may be increased.

The D-type flip flops 1 and 1', only when the data enabling signal is active, are adapted to capture the data input DATA (I) and (I') outputted from the selector circuits 3 and 3' by the rising edge of the clock signal and, when the data enabling signal is inactive, to capture the data output DATA (O) and (O') by a rising edge of the clock signal, causing no malfunctions in the gated clock type logic circuit.

Fifth Embodiment

Figure 10:
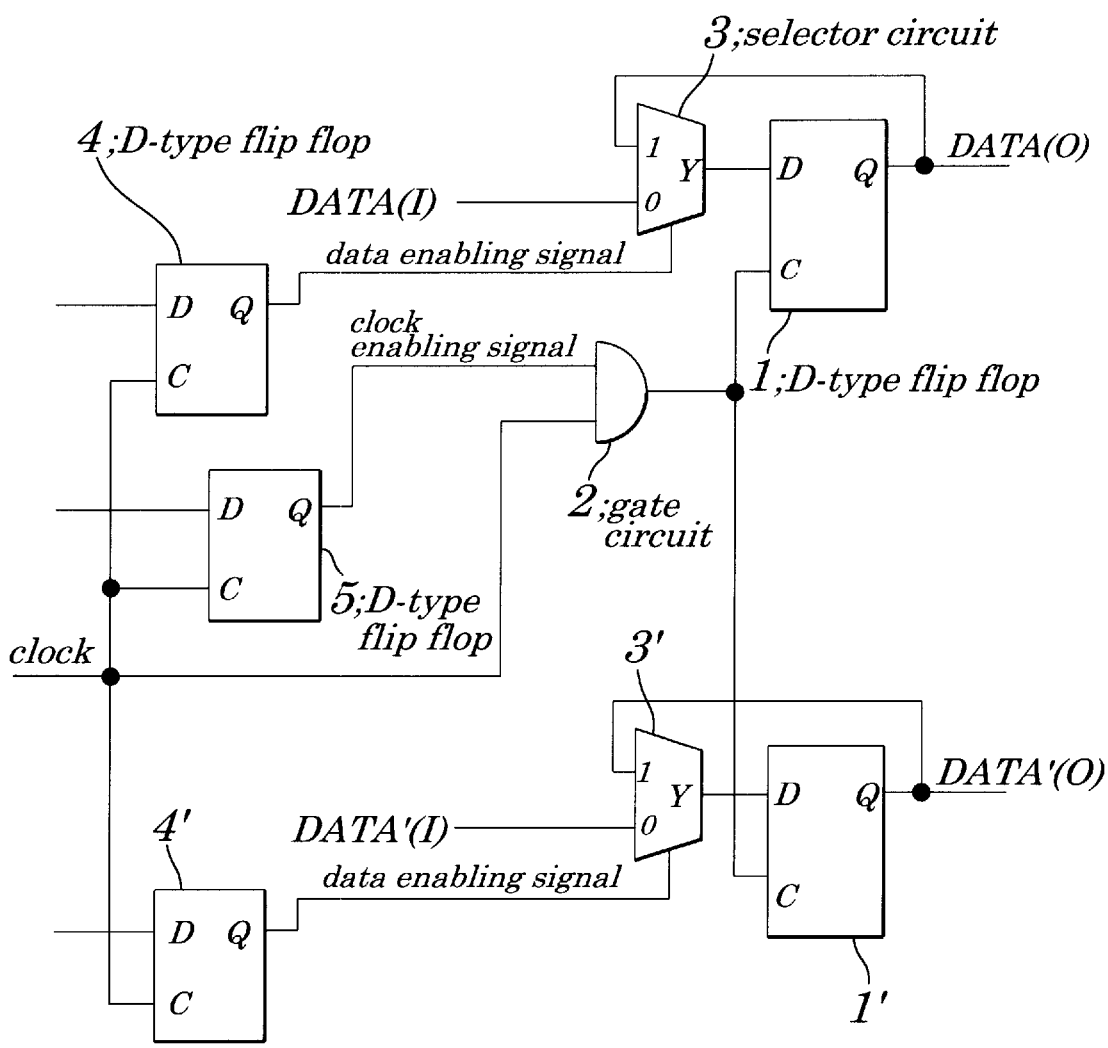
FIG. 10 is a schematic block diagram showing configurations of a gated clock type logic circuit according to a fifth embodiment of the present invention.
Figure 11:
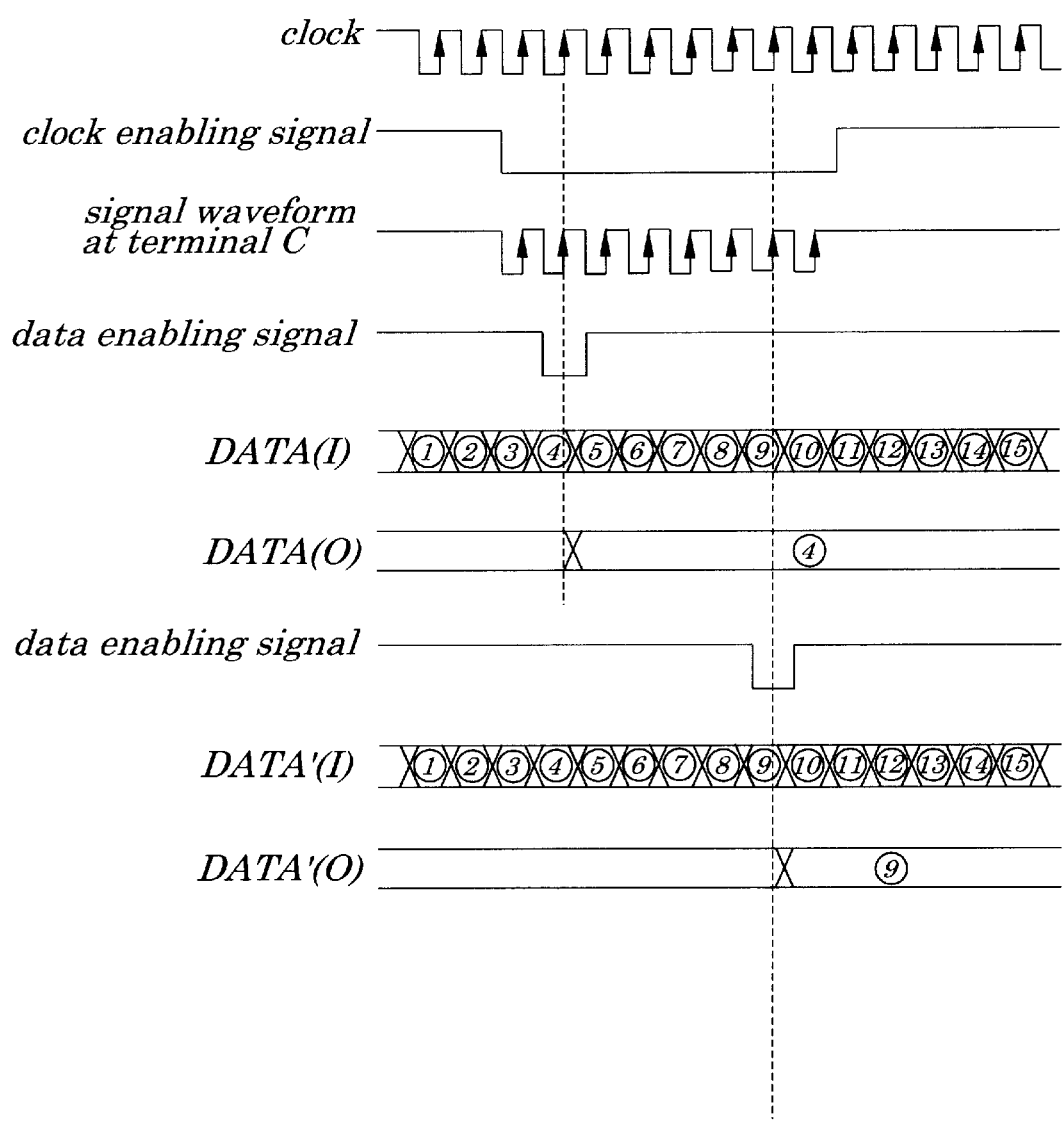
FIG. 11 is a timing chart explaining operations of the gated clock type logic circuit according to the fifth embodiment of the present invention.

FIG. 10 is a schematic block diagram showing configurations of a gated clock type logic circuit according to a fifth embodiment. Referring to FIG. 10, in the fifth embodiment, to a selector circuit 3 is fed a data enabling signal from a D-type flip flop 4 and to a selector circuit 3' is fed a data enabling signal from a D-type flip flop 4', and there is provided only one gate circuit 2 which is adapted to control a supply or a stop of the supply of a clock to each of input terminals of D-type flip flops 1 and 1', that is, the gate circuit 2 is used in common for the D-type flip flop 5. A clock enabling signal to be fed to the gate circuit 2 is supplied from a D-type flip flop 5. By configuring so that a same clock enabling signal is fed in common, a count of the gate circuits is reduced, thus simplifying a clock supplying line and allowing easy designing of the circuit. FIG. 11 is a timing chart explaining operations of the gated clock type logic circuit according to the fifth embodiment.

Sixth Embodiment

Figure 12:
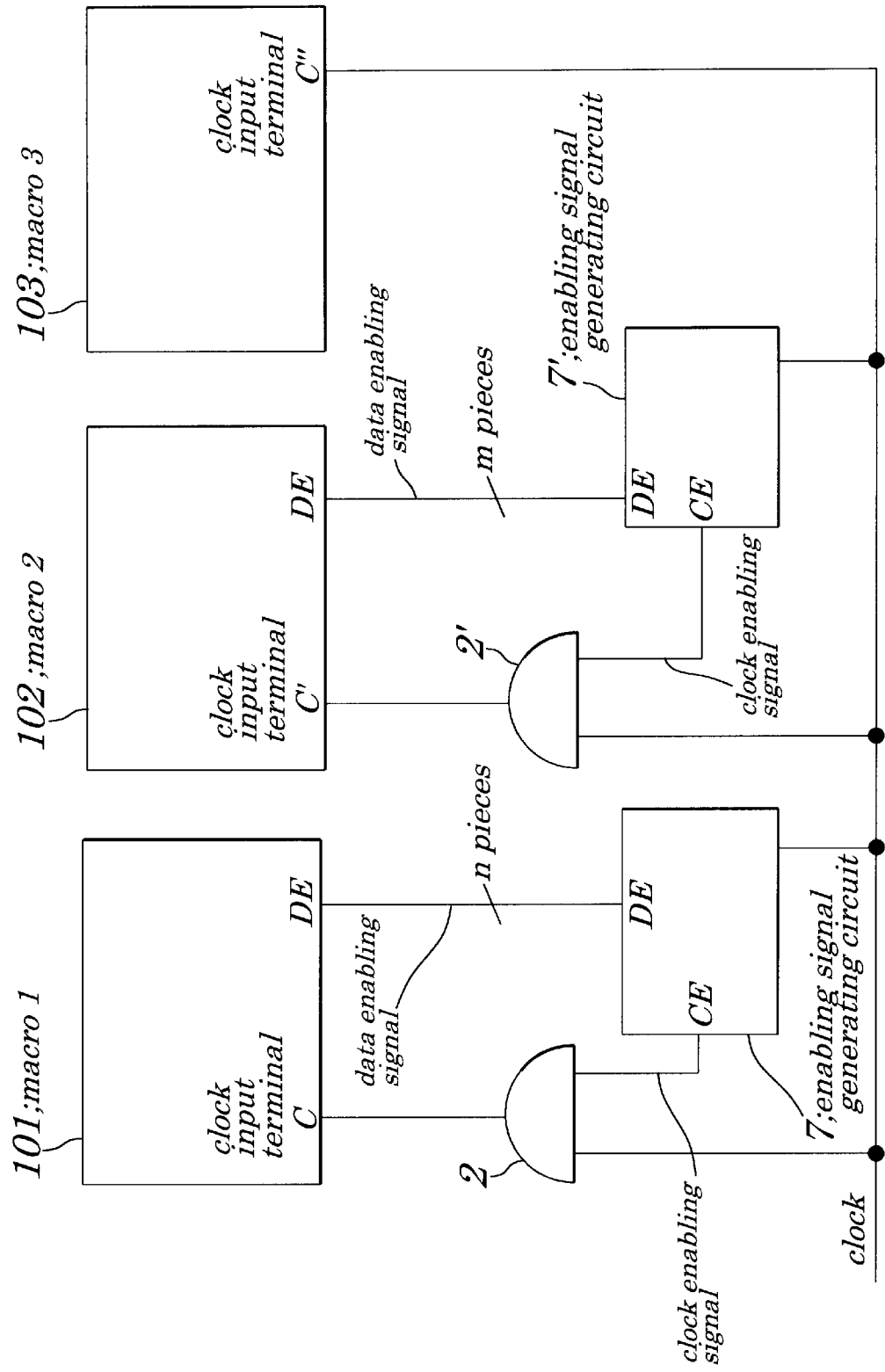
FIG. 12 is a schematic block diagram showing configurations of a gated clock type logic circuit according to a sixth embodiment of the present invention.

FIG. 12 is a schematic block diagram showing configurations of a gated clock type logic circuit according to a sixth embodiment, which is employed in a highly integrated circuit such as an LSI. An operational and functional unit driven by one gated clock is defined as "one macro" and, in this embodiment, there are provided two kinds of macros, a first macro 1 and a second macro 2 to each of which a clock is supplied. A clock enabling signal outputted from an enabling signal generating circuit 7 is fed through a gate circuit 2 to a clock input terminal of the macro 1 and the clock enabling signal outputted form an enabling signal generating circuit 7' is fed through a gate circuit 2' to a clock input terminal of the macro 2. By configuring so that a gated clock is employed for every functional unit including the macro 1 and macro 2, design is made simple. Flip flops contained within the first and second macros are driven by data enabling signals (DE) and these flip flops operate to capture data by an edge of a clock while the clock enabling signal is active.

Moreover, in FIG. 12, a macro 3 is provided with no gated clock. The macro 1 and macro 2 to which the clock is supplied by a gated clock method and the macro 3 to which a clock is not supplied by a gated clock method may exist in a circuit in a mixed state. The number of macros to which the clock is supplied or not supplied by the gated clock is not limited to examples of the embodiment shown in FIG. 12.

Methods by which each enabling signal is put together based on the gated clock, on the functional unit or a position of a timing pulse of the enabling signal are available. However, if a count of signals to be put together is increased, since an enable period of the clock enable signal becomes long, an effect of lowering power consumption by stopping supply of the clock becomes weak. In this case, functions and/or timing position must be carefully taken into consideration.

Seventh Embodiment

Figure 13:
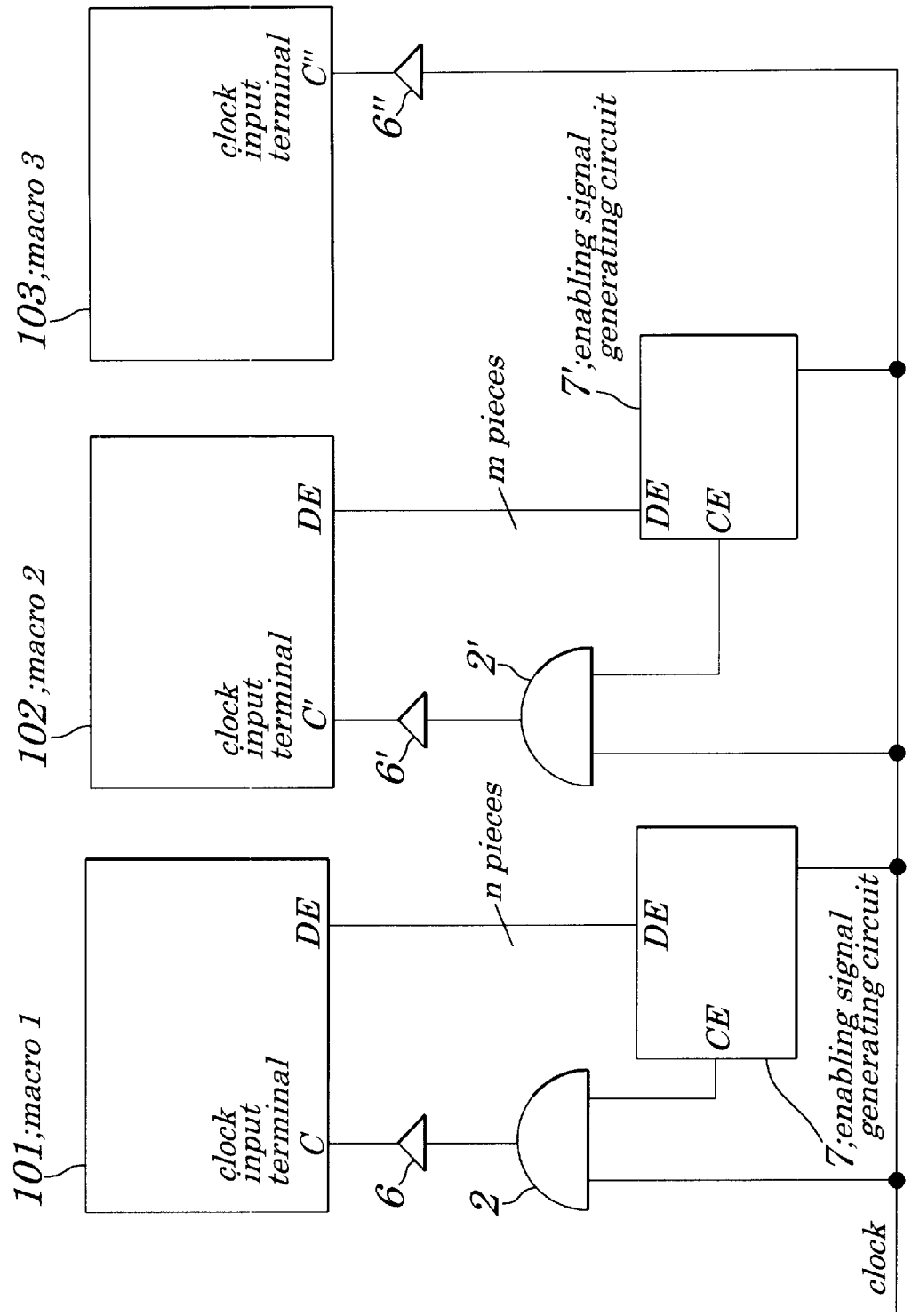
FIG. 13 is a schematic block diagram showing configurations of a gated clock type logic circuit according to a seventh embodiment of the present invention.
Figure 14:
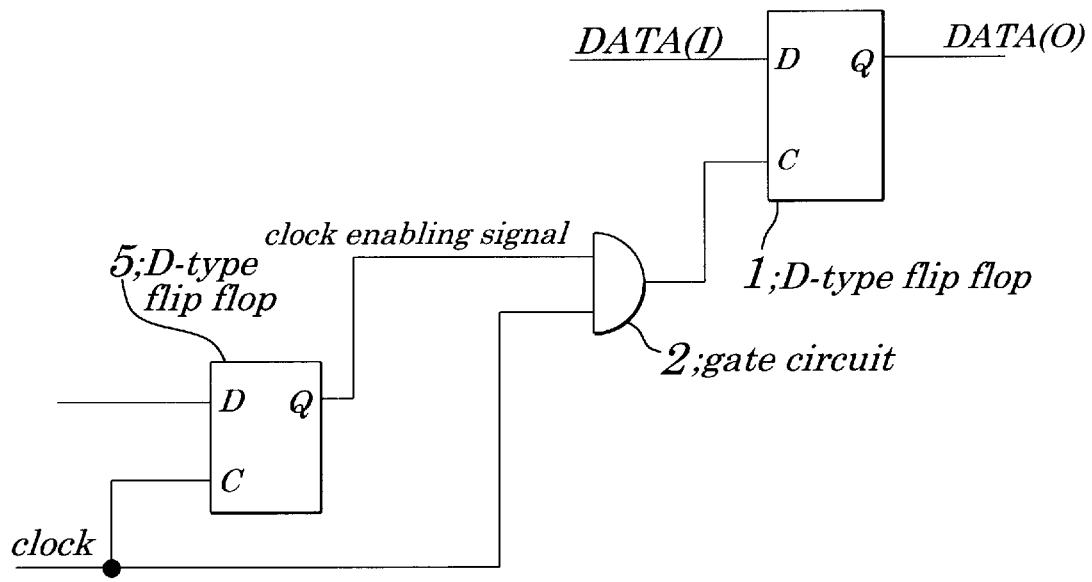
FIG. 14 is a schematic block diagram showing one example of configurations of a conventional gated clock type logic circuit.
Figure 15:
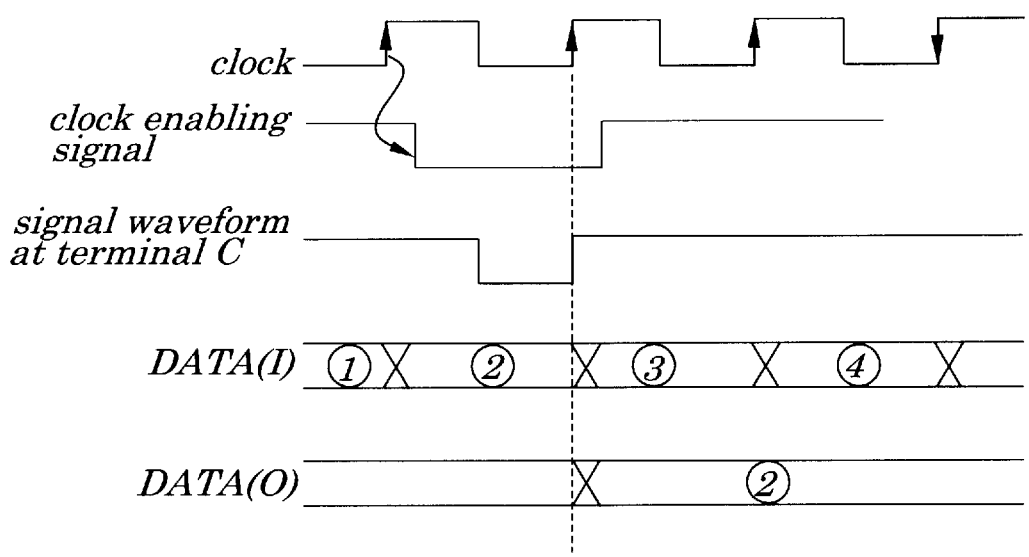
FIG. 15 is a timing chart showing operations of the conventional gated clock type logic circuit.
Figure 16:
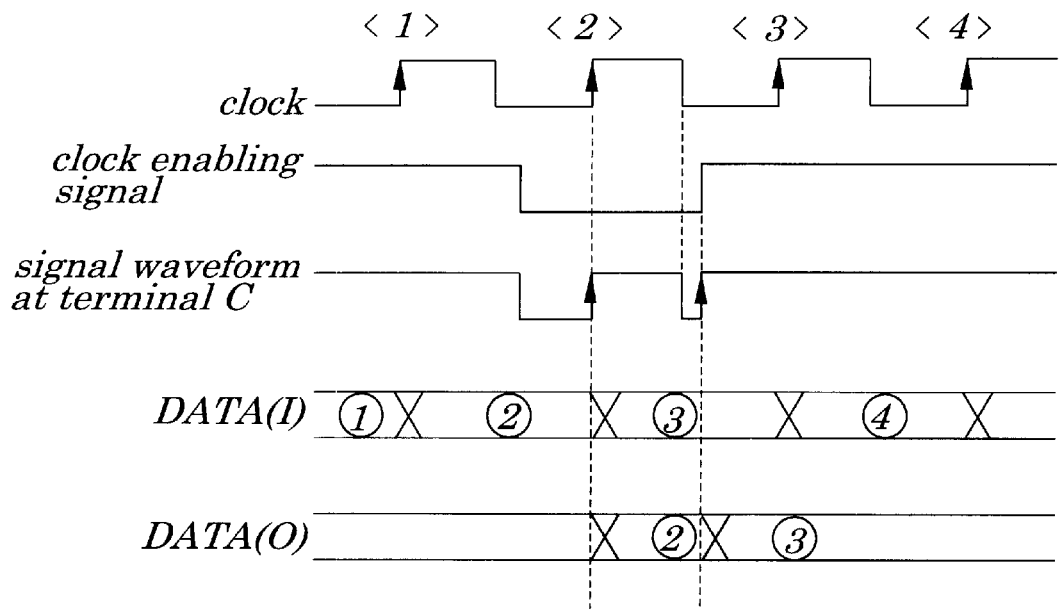
FIG. 16 is a timing chart showing operations of the conventional gated clock type logic circuit.
Figure 17:
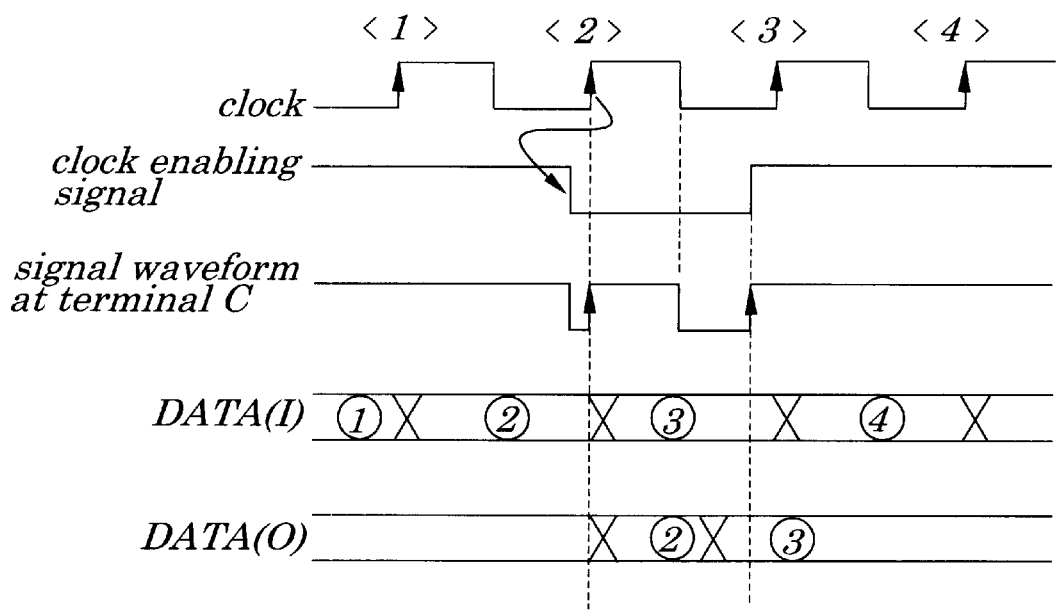
FIG. 17 is a timing chart showing operations of the conventional gated clock type logic circuit.

FIG. 13 is a schematic block diagram showing configurations of a gated clock type logic circuit according to a seventh embodiment. According to the seventh embodiment, to each gated clock supplying line are connected buffers 6, 6' and 6'' which are used to make equal a delayed time of CTS (Clock Tree Synthesis) so that clocks are in phase at clock input terminals C, C' and C'' of a first macro 101, a second macro 102 and third macro 103. Since clock phases at clock input terminals of all macros are made equal, tuning of the phase among macros is not required, thus allowing synthesis of each macro by using a general logic synthesis tool and making the designing of the logic circuit easy.

Moreover, in FIGS. 12 and 13, though not shown, signal wirings are installed among macros to send and receive signals among them.

As described above, according to the present invention, the following effects can be achieved:

(1) A gated clock supplying method can be employed in designing a logic circuit without giving any consideration to timing of a clock supplying line, thus allowing a time period required for designing to be shortened and power consumption in the logic circuit to be lowered.

(2) Since no consideration is required for adjusting the timing of the clock signal, the gated clock type logic circuit can be employed even in highly integrated circuits such as LSIs, thus allowing power consumption in LSIs to be lowered. Because an increase in time required for designing signal timing is proportional to an increase in a count of gated clock supplying lines used in a device, use of the gated clock type logic circuits tends to generally be minimized especially in the case of highly integrated circuits such as LSIs, that is to say, there is a relation of a trade-off between lowered power consumption in a circuit and ease in designing and period required for designing. However, by using the gated clock type logic circuit of the present invention, this problem can be solved.

(3) A logic synthesizing tool can be used only by describing a gate insertion in the clock supplying line.

(4) When the clock is supplied in a gated manner, since a timing delay of one clock in the clock enabling signal is permissible, a gated clock type logic circuit can be employed in high speed circuits having short clock periods.

It is thus apparent that the present invention is not limited to the above embodiments but may be changed and modified without departing from the scope and spirit of the invention.

Finally, the present application claims the priority of Japanese Patent Application No. Hei11-149081 filed on May 28, 1999, which is herein incorporated by reference.

What is claimed is:

1. A logic circuit comprising:

a gate circuit that receives an input clock signal and, in accordance with a clock enable signal, allows said input clock signal to be passed or to be masked;

a latch circuit, said latch circuit including a clock input terminal and a data input terminal, said clock input terminal is coupled to an output of said gate circuit; and a selector circuit which receives input data and which receives an output of said latch circuit, said selector circuit outputs one of said input data or said output of said latch circuit to said data input terminal of said latch circuit based on a data enabling signal received by said selection circuit.

2. The logic circuit according to claim 1, further comprising:

a first additional latch circuit that latches said data enabling signal fed from a signal source by using said clock signal and outputs said latched data enabling signal to said selector circuit; and a second additional latch circuit that latches said clock enabling signal fed from said signal source by using said input clock signal and outputs said latched clock enabling signal to said gate circuit.

3. The logic circuit according to claim 1, wherein said latch circuit is a D-type flip flop.

4. The logic circuit as recited in claim 1, wherein:

said gate circuit includes a plurality of gate circuits;

said latch circuit includes a plurality of latch circuits;

said selector circuit includes a plurality of selector circuits; and wherein said data enabling signal is coupled to all of said selector circuits.

5. A logic circuit comprising:

two or more latch circuits, each latch circuit including a clock input terminal and a data input terminal;

two or more selectors, said selectors receive input data and receive data output from respective ones of said two or more latch circuits selectors output to respective latch circuits one of said input data or said data output by-said latch circuits based on a data enabling signal received by said selectors;

a gate circuit which receives an input clock signal and, based on a clock enabling signal, allows said input clock signal to be passed to said two or more latch circuits or to be masked from said latch circuits; and where an output of each of said selectors is fed to a corresponding data input terminal of each of said latch circuits and wherein an output of said gate circuit is fed to a corresponding one of said clock input terminals of said latch circuits.

6. The logic circuit according to claim 5, further comprising:

at least a first additional latch circuit which latches two or more said data enabling signals fed from signal sources by said input clock signal and supplies said data enabling signals to said two or more selectors; and at least a second additional latch circuit which latches said clock enabling signal fed from said signal source by using said input clock signal and supplies said latched clock enabling signal to said gate circuit.

7. The logic circuit according to claim 5, wherein each latch circuit is a D-type flip flop.

8. A semiconductor integrated circuit comprising:

a macro including two or more latch circuits;

two or more selectors, said selectors receive input data and receive data output from respective ones of said two or more latch circuits, said selectors output to respective latch circuits one of said input data or said data output by said latch circuits based on data enabling signals as selecting signals;

a gate circuit which receives an input clock signal and, based on a clock enabling signal, allows said input clock signal to be passed to said macros or to be masked from said macros; and wherein said output from said gate circuit is fed to a clock input terminal of said macro and wherein a clock inputted to clock input terminal of said macro is simultaneously fed to said two or more latch circuits in said macro.

9. The semiconductor integrated circuit according to claim 8, further comprising another macro having no gate circuit, all of said macros operate to allow said input clock signal to be passed to a respective clock input terminal or to be masked from said respective clock input terminal, so that said macros exist in a same chip in a mixed state.

10. The semiconductor integrated circuit according to claim 8, wherein a buffer operating to make a signal delay equal is provided between said gate circuit and said clock input terminal.

11. The semiconductor integrated circuit according to claim 9, wherein a buffer operating to make a signal delay equal is provided in each of said clock input terminals of said macros into which said input clock signal is inputted.

* * * * *